United States Patent
Oomoto

(10) Patent No.: US 8,135,366 B2
(45) Date of Patent: Mar. 13, 2012

(54) WIRELESS COMMUNICATION CIRCUIT AND WIRELESS COMMUNICATION SYSTEM

(75) Inventor: Tatsuro Oomoto, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 599 days.

(21) Appl. No.: 12/332,166

(22) Filed: Dec. 10, 2008

(65) Prior Publication Data

US 2009/0163165 A1 Jun. 25, 2009

(30) Foreign Application Priority Data

Dec. 13, 2007 (JP) ................. 2007-321769

(51) Int. Cl.
*H04B 1/06* (2006.01)

(52) U.S. Cl. ............... 455/232.1; 455/234.1; 455/253.2

(58) Field of Classification Search ............ 455/232.1, 455/253.2, 234.1
See application file for complete search history.

(56) References Cited

U.S. PATENT DOCUMENTS

| | | | | |
|---|---|---|---|---|
| 6,891,440 B2 * | 5/2005 | Straub et al. | ................. | 331/1 R |
| 6,965,655 B1 | 11/2005 | Mostov et al. | | |
| 7,005,922 B2 | 2/2006 | Oshima et al. | | |
| 2006/0038710 A1* | 2/2006 | Staszewski et al. | ........... | 341/143 |
| 2007/0049228 A1 | 3/2007 | Fujishima et al. | | |

FOREIGN PATENT DOCUMENTS

JP 2007-097123 4/2007

* cited by examiner

*Primary Examiner* — Jean Jeanglaude
(74) *Attorney, Agent, or Firm* — Turocy & Watson, LLP

(57) ABSTRACT

A wireless communication circuit has a second control circuit which reduces the gain of the differential converter when the signal level of the RF signal is at least a specified level and the RF signal includes a disturbing wave of a predetermined level or higher.

12 Claims, 5 Drawing Sheets

WIRELESS COMMUNICATION CIRCUIT AND WIRELESS COMMUNICATION SYSTEM

CROSS-REFERENCE TO RELATED APPLICATION

This application is based upon and claims the benefit of priority from the prior Japanese Patent Application No. 2007-321769, filed on Dec. 13, 2007, the entire contents of which are incorporated herein by reference.

BACKGROUND OF THE INVENTION

1. Field of the Invention

The present invention relates to a wireless communication circuit used for, for example, wireless communications such as digital TV broadcasting, and a wireless communication system.

2. Background Art

In the prior art, a high frequency receiver (wireless communication circuit) used for receiving digital TV broadcasting such as digital terrestrial broadcasting, one-segment broadcasting, and three-segment broadcasting controls the gain of an amplifier for amplifying a received signal (for example, see Japanese Patent Laid-Open No. 2007-97123).

In order to reduce the influence of a disturbing wave, the wireless communication circuit of the prior art reduces the gain of the amplifier under receiving conditions in a strong electric field area such that the gain becomes smaller than a gain under receiving conditions in a weak electric field area.

SUMMARY OF THE INVENTION

According to one aspect of the present invention, there is provided: a wireless communication circuit, comprising:

a low noise amplifier which can switch a gain to a first gain or a second gain lower than the first gain, and amplifies and outputs, with a set gain, an RF signal;

a first gain control amplifier which has a variable gain and amplifies and outputs the signal outputted from the low noise amplifier;

a differential converter which has a variable gain and outputs a differential signal obtained by differential conversion on the signal outputted from the first gain control amplifier;

a mixer circuit which outputs a signal obtained by mixing an oscillation signal and the differential signal;

a filter which filters the signal outputted from the mixer circuit;

a second gain control amplifier which has a variable gain, amplifies and outputs the signal outputted from the filter;

a first control circuit which detects the output signal of the mixer circuit and controls the gains of the low noise amplifier and the first gain control amplifier such that a signal level of the output signal reaches a set reference level; and a second control circuit which controls the gain of the differential converter and the reference level of the first control circuit based on a signal level of the RF signal and a signal level of a disturbing wave included in the RF signal, and reduces the gain of the differential converter when the signal level of the RF signal is at least a specified level and the RF signal includes a disturbing wave of a predetermined level or higher.

According to the other aspect of the present invention, there is provided: a wireless communication circuit, comprising:

a low noise amplifier which can switch a gain to a first gain or a second gain lower than the first gain, and amplifies and outputs, with a set gain, an RF signal;

a first gain control amplifier which has a variable gain and amplifies and outputs the signal outputted from the low noise amplifier;

a differential converter which outputs a differential signal obtained by differential conversion on the signal outputted from the first gain control amplifier;

a mixer circuit which has a variable gain and outputs a signal obtained by mixing an oscillation signal and the differential signal;

a filter which filters the signal outputted from the mixer circuit;

a second gain control amplifier which has a variable gain, amplifies and outputs the signal outputted from the filter;

a first control circuit which detects the output signal of the mixer circuit and controls the gains of the low noise amplifier and the first gain control amplifier such that a signal level of the output signal reaches a set reference level; and a second control circuit which controls the gain of the mixer circuit and the reference level of the first control circuit based on a signal level of the RF signal and a signal level of a disturbing wave included in the RF signal, and reduces the gain of the mixer circuit when the signal level of the RF signal is at least a specified level and the RF signal includes a disturbing wave of a predetermined level or higher.

According to another aspect of the present invention, there is provided: a wireless communication system, comprising:

an antenna;

a low noise amplifier which can switch a gain to a first gain or a second gain lower than the first gain, and amplifies and outputs, with a set gain, an RF signal inputted through the antenna;

a first gain control amplifier which has a variable gain and amplifies and outputs the signal outputted from the low noise amplifier;

a differential converter which has a variable gain and outputs a differential signal obtained by differential conversion on the signal outputted from the first gain control amplifier;

a voltage controlled oscillator which outputs an oscillation signal;

a PLL circuit which controls an oscillatory frequency of the oscillation signal by supplying a control voltage to the voltage controlled oscillator;

a mixer circuit which outputs a signal obtained by mixing the oscillation signal or a signal frequency-divided from the oscillation signal and the differential signal;

a filter which filters the signal outputted from the mixer circuit;

a second gain control amplifier which has a variable gain, amplifies and outputs the signal outputted from the filter;

a first control circuit which detects the output signal of the mixer circuit and controls the gains of the low noise amplifier and the first gain control amplifier such that a signal level of the output signal reaches a set reference level;

a second control circuit which controls the gain of the differential converter and the reference level of the first control circuit based on a signal level of the RF signal and a signal level of a disturbing wave included in the RF signal, and reduces the gain of the differential converter when the signal level of the RF signal is at least a specified level and the RF signal includes a disturbing wave of a predetermined level or higher;

an analog digital converter which outputs a signal obtained by analog digital conversion on the signal outputted from the second gain control amplifier;

a third control circuit which controls the gain of the second gain control amplifier based on the signal outputted from the analog digital converter; and a digital signal processing circuit which processes the signal outputted from the analog digital converter.

DETAILED DESCRIPTION

Embodiments to which the present invention is applied will be described below with reference to the accompanying drawings.

First Embodiment

In the present embodiment, three modes are controlled which include the gain of a single-to-differential converter circuit, the detection level of the output of a mixer circuit, and the gain of a low noise amplifier in a wireless communication circuit. Thus even when a disturbing wave at a different frequency from a desired wave has a higher signal level than the desired wave, a system is controlled so as to input the desired wave having a sufficient signal level to the mixer circuit.

Consequently, the C/N value of an IF output is improved.

Figure 1:
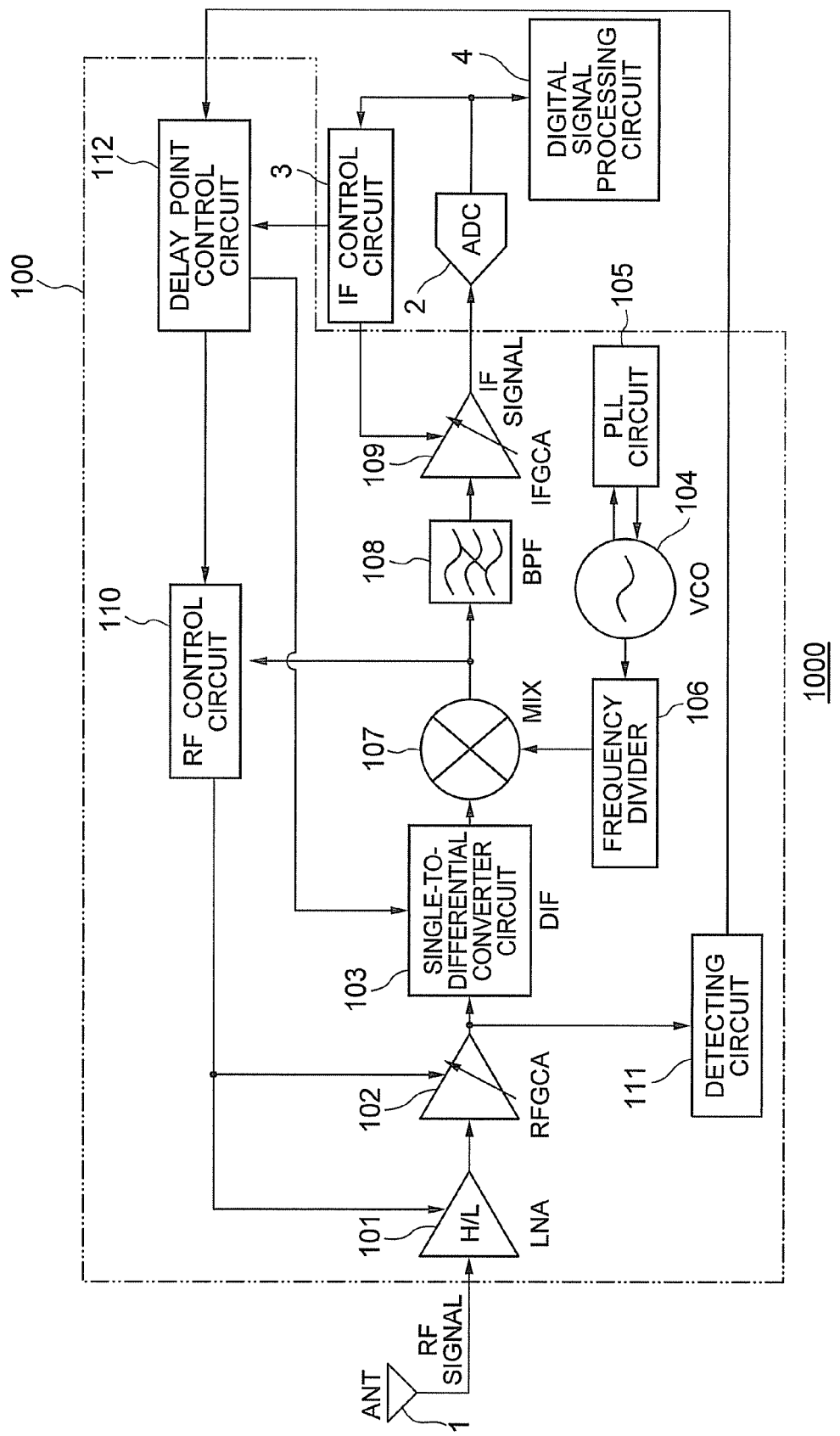
FIG. 1 is a block diagram showing an example of the configuration of a wireless communication system 1000 including a wireless communication circuit 100 according to a first embodiment which is an aspect of the present invention.

FIG. 1 shows an example of the configuration of a wireless communication system 1000 including a wireless communication circuit 100 according to a first embodiment which is an aspect of the present invention.

As shown in FIG. 1, the wireless communication system 1000 includes an antenna 1 and the wireless communication circuit 100.

The wireless communication circuit 100 includes a low noise amplifier (LNA) 101, an RF gain control amplifier (RFGCA) 102, a single-to-differential converter circuit (DIF) 103, a voltage controlled oscillator (VCO) 104, a PLL (phase-locked loop) circuit 105, a frequency divider 106, and a mixer circuit (MIX) 107.

The wireless communication circuit 100 further includes a band-pass filter (BPF) 108, an intermediate frequency (IF) gain control amplifier 109, an RF control circuit (first control circuit) 110, a detecting circuit 111, and a delay point control circuit (second control circuit) 112.

The low noise amplifier 101 can switch a gain to a first gain or a second gain (−6 dB) lower than the first gain (for example, 12 dB). The low noise amplifier 101 amplifies, with a set gain, an RF signal (for example, a frequency band of 170 MHz to 800 MHz) inputted through the antenna 1 and then outputs the RF signal.

In this case, the RF signal (input signal) may include a desired wave, which is a signal of a channel to be received, and a disturbing wave which may be received from the antenna 1.

The RF gain control amplifier 102 amplifies the signal outputted from the low noise amplifier 101 and then outputs the signal. The RF gain control amplifier 102 has a variable gain (for example, from −34 dB to 18 dB).

The single-to-differential converter circuit 103 outputs a differential signal obtained by single-to-differential conversion on the signal outputted from the RF gain control amplifier 102. The single-to-differential converter circuit 103 has a variable gain (for example, the gain can be changed to 5 dB or 10 dB).

The voltage controlled oscillator 104 outputs an oscillation signal having an oscillatory frequency controlled according to a supplied control voltage.

The PLL circuit 105 controls the oscillatory frequency of the oscillation signal by supplying the control voltage to the voltage controlled oscillator 104. Thus the phase of the oscillation signal is fixed at a predetermined value.

The frequency divider 106 divides the frequency of the oscillation signal outputted from the voltage controlled oscillator 104, and then outputs, to the mixer circuit 107, an oscillation signal having a predetermined frequency obtained by the frequency division.

The mixer circuit 107 mixes the oscillation signal and the differential signal and then outputs a signal obtained by converting the frequency components of the sum of the oscillation signal and the differential signal and a difference between the signals. In this case, the gain of the mixer circuit 107 is set at, for example, 10 dB.

The band-pass filter 108 filters the differential signal outputted from the mixer circuit 107. In this case, the gain of the band-pass filter 108 is set at, for example, 13 dB.

The IF gain control amplifier 109 outputs an IF signal obtained by amplifying a signal outputted from the band-pass filter 108. The IF gain control amplifier 109 has a variable gain (for example, from −8 dB to 50 dB).

The RF control circuit 110 detects the output signal (differential signal) of the mixer circuit 107 and controls the gains of the low noise amplifier 101 and the RF gain control amplifier 102 such that the signal level of the output signal reaches a set reference level (detection level) Lb. The RF control circuit 110 can switch the reference level Lb to, for example, −15 dB or −20 dB.

The detecting circuit 111 detects the signal level of the RF signal and a disturbing wave included in the RF signal. In other words, the detecting circuit 111 detects whether or not the signal level of the RF signal is at least a specified level (for example, −60 dB or higher) and whether or not the RF signal includes a disturbing wave of a certain level (for example, a signal at a higher level than a desired wave by at least 10 dB). The detection result is inputted to the delay point control circuit 112.

In this case, an electric field where the signal level of the RF signal is at least the specified level (for example, at least −60 dB) is defined as a strong electric field, and an electric field where the signal level of the RF signal is lower than the specified level is defined as a weak electric field.

The delay point control circuit 112 controls the gain of the single-to-differential converter circuit 103, controls the reference level Lb of the RF control circuit 110, and controls the gain of the low noise amplifier 101 through the RF control circuit 110, based on the detection result of the detecting circuit 111.

When the signal level of the RF signal is at least the specified level and the RF signal includes a disturbing wave of the certain level or higher than the desired wave, the delay point control circuit 112 controls the gain of the single-to-differential converter circuit 103 so as to reduce the gain.

As shown in FIG. 1, the wireless communication system 1000 further includes an analog digital converter (ADC) 2, an IF control circuit (third control circuit) 3, and a digital signal processing circuit 4.

The analog digital converter 2 outputs a digital signal obtained by analog-digital conversion on the IF signal outputted from the IF gain control amplifier 109.

The IF control circuit 3 controls the gain of the IF gain control amplifier 109 based on the digital signal outputted from the analog digital converter 2 such that the signal level of the IF signal reaches a desired level.

The digital signal processing circuit 4 processes the digital signal outputted from the analog digital converter 2.

The following will describe the operating characteristics of the wireless communication circuit 100 in the wireless communication system 1000 configured thus.

A C/N value of the IF signal outputted from the IF gain control amplifier 109 is specified according to the noise floor level of an output signal. Broadly speaking, the noise floor level of the IF signal is determined by the sum of a noise amount determined based on the noise figure (NF) of the wireless communication circuit 100, which is a tuner receiving system, and a noise amount determined based on distortion characteristics (for example, tertiary distortion IM3) as expressed in formula (1) below:

$$\text{The noise floor level of the } IF \text{ signal} = \text{a noise amount determined based on the } NF \text{ of the system} + \text{a noise amount determined based on the } IM3 \text{ of the system} \quad (1)$$

Basically the relationship between the NF and the distortion characteristics is a tradeoff. In other words, the IM3 is degraded by improving the NF of the system and the NF is degraded by improving the IM3.

Thus it is necessary to adjust the characteristics of the IM3 and the NF to the optimum point to optimize the C/N value of the IF signal.

In the wireless communication circuit of the prior art, when an RF signal has a low level (for example, less than −60 dBm (weak electric field)), an IF signal has a proper C/N value. When the RF signal has a high level (for example, at least −60 dBm (strong electric field)), the C/N value of the IF signal is degraded.

The following will describe the case where a disturbing wave is present in a strong electric field. In an area of a strong electric field, the C/N value of the IF signal is determined according to a noise amount determined based on the NF of the system, as expressed in formula (2) below:

$$\text{A noise amount determined based on the } NF \text{ of the system} > \text{a noise amount determined based on the } IM3 \text{ of the system} \quad (2)$$

In the wireless communication circuit 100 of the present embodiment, the RF signal has a high signal level (strong electric field). When it is decided that the RF signal includes a disturbing wave of the certain level or higher, the NF of the system is improved. Thus the distortion characteristics (IM3) deteriorate, whereas the C/N value of the IF signal is improved, the C/N value being specified based on characteristics obtained by adding the noise amounts of the NF and the IM3.

For example, the relationship between a noise amount determined based on the NF of the system and a noise amount determined based on the IM3 of the system is controlled as expressed in formula (3). Thus the noise floor level of the IF signal, that is, the sum of the noise amounts of the NF and the IM3 is minimized and the C/N value can be improved to the highest level.

$$\text{A noise amount determined based on the } NF \text{ of the system} \approx \text{a noise amount determined based on the } IM3 \text{ of the system} \quad (3)$$

In order to improve the NF of the system when the RF signal has a high signal level (strong electric field), a delay point (a point where the RF gain control amplifier 102 starts operating) is preferably shifted to a higher signal level of the RF signal. For this purpose, the following two methods are available:

1) The detection level of the mixer circuit 107 is increased (for example, by 5 dB).
2) Gains are reduced in the block of the previous stage of the mixer circuit 107 (in this case, the gains of the low noise amplifier 101 and the single-to-differential converter circuit 103 are reduced).

Even only method 1) can shift the delay point to a higher signal level of the RF signal.

When only method 1) is used, the signal level of the signal inputted to the mixer circuit 107 is limited. In other words, when the detection level of the mixer circuit 107 is increased, the signal level of the signal inputted to the mixer circuit 107 is increased and the distortion characteristics (IM3) are deteriorated. Therefore, there is an upper limit of the detection level because of the distortion characteristics required for a product and so on.

Thus a combination of method 1) and method 2) can shift the delay point to a higher signal level of the RF signal.

The signal level of the signal inputted to the mixer circuit 107 can be increased by method 1) and method 2), so that the IM3 of the wireless communication circuit 100 degrades but the NF of the wireless communication circuit 100 is improved. Therefore, the noise floor level of the IF signal, that is, the sum of a noise amount determined based on the IM3 and a noise amount determined based on the NF is reduced and the C/N value is improved.

The following will describe an example of the operation of the wireless communication circuit 100 in the wireless communication system 1000 for obtaining the above operating characteristics.

Figure 2:
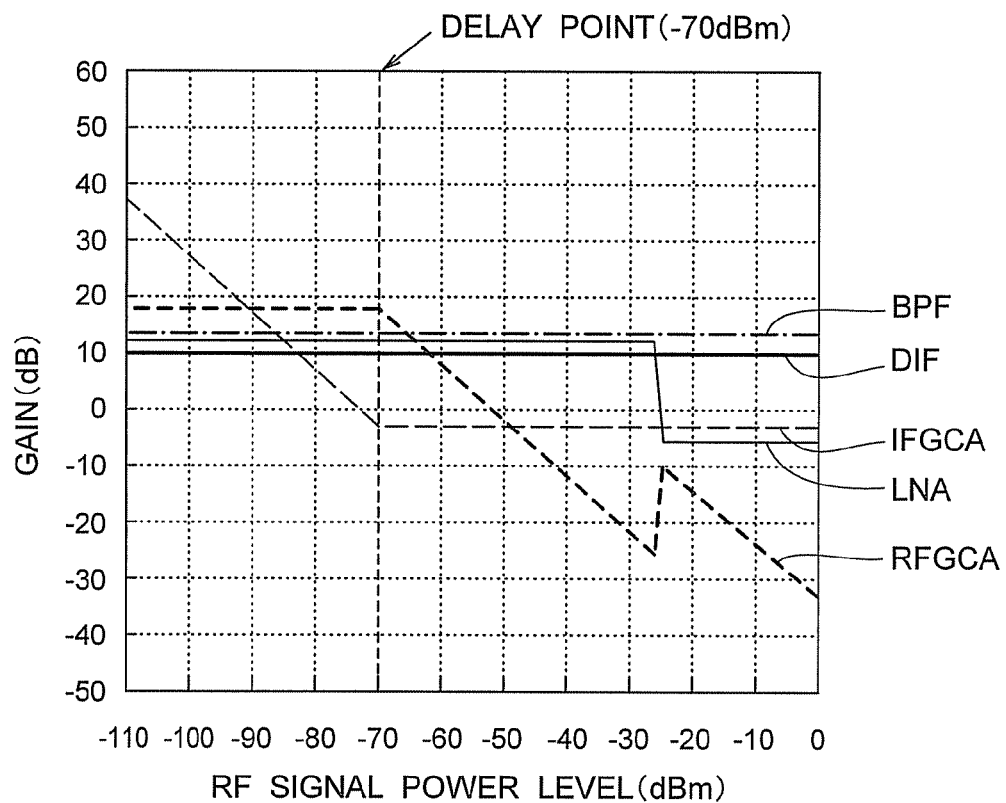
FIG. 2 is a graph showing the relationship between the signal level of the RF signal and the gains of the configurations of the wireless communication circuit 100 in a normal operation (when the RF signal does not include a disturbing wave of the certain level or higher)

FIG. 2 shows the relationship between the signal level of the RF signal and the gains of the configurations of the wireless communication circuit 100 in a normal operation (when the RF signal does not include a disturbing wave of the certain level or higher). In this normal operation, the RF control circuit 110 of the wireless communication circuit 100 has a detection level set at −20 dB.

As shown in FIG. 2, the RF control circuit 110 detects the output signal of the mixer circuit 107, sets the gain of the low noise amplifier 101 at the second gain (−6 dB), and controls the gain of the RF gain control amplifier 102 in a range from −34 dB to −9 dB when the RF signal has a signal level of 0 dBm to −25 dBm.

The RF control circuit 110 detects the output signal of the mixer circuit 107, sets the gain of the low noise amplifier 101 at the first gain (12 dB), and controls the gain of the RF gain control amplifier 102 in a range from −26 dB to 18 dB when the RF signal has a signal level of −25 dBm to −70 dBm.

With this operation, when the RF signal has a signal level of 0 dBm to −70 dBm, the RF control circuit 110 controls the gains of the low noise amplifier 101 and the RF gain control amplifier 102 such that the signal level of the output signal of the mixer circuit 107 reaches the set detection level Lb (−20 dB).

When the RF signal has a signal level of −70 dBm to −110 dBm, the gain of the RF gain control amplifier 102 is set at the maximum value of 18 dB and the gain of the low noise amplifier 101 is set at the first gain (12 dB).

Further, when the RF signal has a signal level of −70 dBm to −110 dBm, the IF control circuit 3 controls the gain of the IF gain control amplifier 109 in a range from −3 dB to 37 dB in response to the digital signal outputted from the analog digital converter 2.

With this operation, the signal level of the IF signal is controlled to a predetermined value.

In FIG. 2, a delay point D.P. is calculated by subtracting the gains of the configurations of the wireless communication circuit 100 from the detection level as expressed in formula (4) below:

$$D.P. = -20 \text{ dBm} - (12 + 18 + 10 + 10) \text{ dBm} \qquad (4)$$

$$= -70 \text{ dBm}$$

In this case, the low noise amplifier 101 has a gain of 12 dB, the RF gain control amplifier has a gain of 18 dB, the DIF 103 has a gain of 10 dB, and the mixer circuit 107 has a gain of 10 dB.

Figure 3:
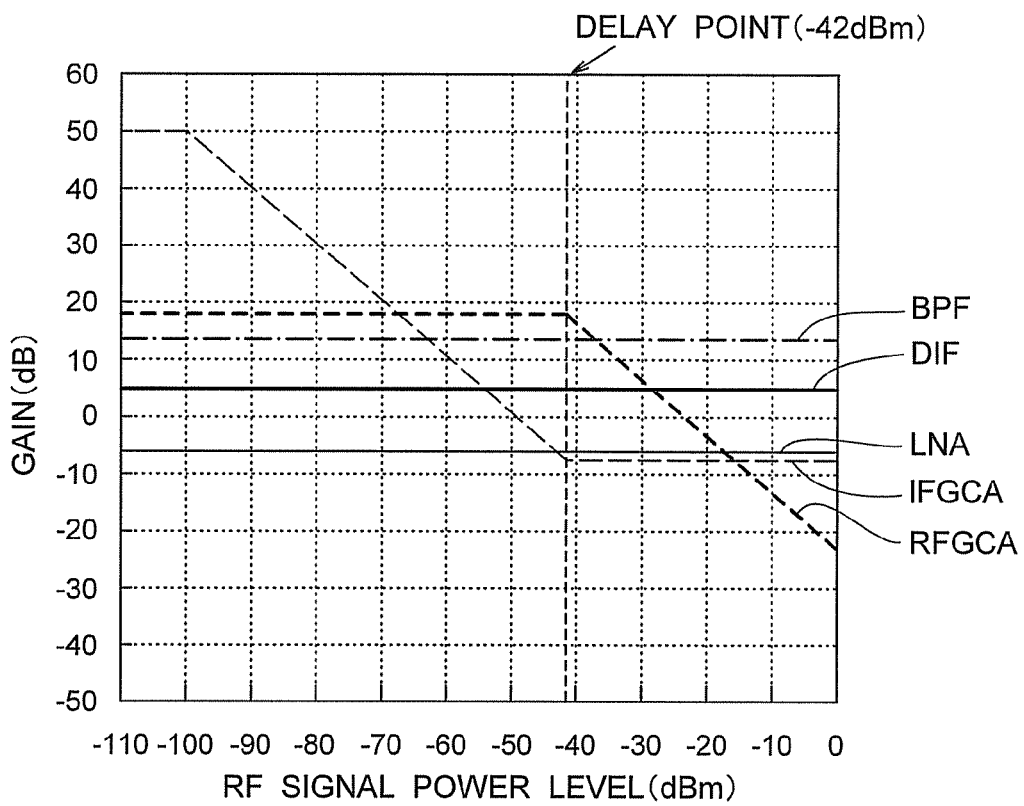
FIG. 3 is a graph showing the relationship between the signal level of the RF signal and the gains of the configurations of the wireless communication circuit 100 when the RF signal has a high signal level (for example, −60 dBm or higher (strong electric field)) and the RF signal includes a disturbing wave of the certain level or higher.

FIG. 3 shows the relationship between the signal level of the RF signal and the gains of the configurations of the wireless communication circuit 100 when the RF signal has a high signal level (for example, −60 dBm or higher (strong electric field)) and the RF signal includes a disturbing wave of the certain level or higher.

As described above, the detecting circuit 111 detects whether or not the RF signal has a high level (for example, −60 dBm or higher (strong electric field)) and whether or not the RF signal includes a disturbing wave of the certain level or higher, and the comparison result is inputted to the delay point control circuit 112.

When the RF signal has a high signal level and the RF signal includes a disturbing wave of the certain level or higher, the delay point control circuit 112 increases the detection level (reference level Lb) of the RF control circuit 110 of the wireless communication circuit 100 by −15 dB, sets the gain of the single-to-differential converter circuit (DIF) 103 at the second gain (5 dB), and causes the RF gain control amplifier 110 to fix the gain of the low noise amplifier 101 at the second gain (−6 dB).

In FIG. 3, the signal level range of the RF signal from −60 dB to −110 dBm is not defined as a strong electric field. Thus in the above case, the signal level range is not within the operating range of the wireless communication circuit 100 but is shown for reference.

As shown in FIG. 3, the RF control circuit 110 detects the output signal of the mixer circuit 107, sets the gain of the low noise amplifier 101 at the second gain (−6 dB), and controls the gain of the RF gain control amplifier 102 in a range from −24 dB to 18 dB when the RF signal has a signal level of 0 dBm to −42 dBm.

Thus the signal level of the signal inputted to the mixer circuit 107 increases, so that the distortion characteristics of the single-to-differential converter circuit 103 may deteriorate. Thus in the present embodiment, the delay point control circuit 112 reduces the gain of the single-to-differential converter circuit 103 from 10 dB to 5 dB, so that the distortion characteristics in the single-to-differential converter circuit 103 are improved. Thus as described above, the C/N value of the IF signal is improved.

In other words, the RF control circuit 110 controls the gains of the low noise amplifier 101 and the RF gain control amplifier 102 through the above operation such that the signal level of the output signal of the mixer circuit 107 reaches the set detection level Lb (−15 dB) when the RF signal has a signal level of 0 dBm to −42 dBm.

When the RF signal has a signal level of −42 dBm to −110 dBm, the IF control circuit 3 controls the gain of the IF gain control amplifier 109 in a range from −8 dB to 50 dB in response to the digital signal outputted from the analog digital converter 2.

With this operation, the signal level of the IF signal is controlled to the predetermined value.

In FIG. 3, the delay point D.P. is calculated by subtracting the gains of the configurations of the wireless communication circuit 100 from the detection level as expressed in formula (5):

$$D.P. = -15 \text{ dBm} - (-6 + 18 + 5 + 10) \text{ dBm} \qquad (5)$$

$$= -42 \text{ dBm}$$

The following will describe the noise characteristics of the IF signal outputted from the wireless communication circuit 100 through the above operation.

Figure 4:
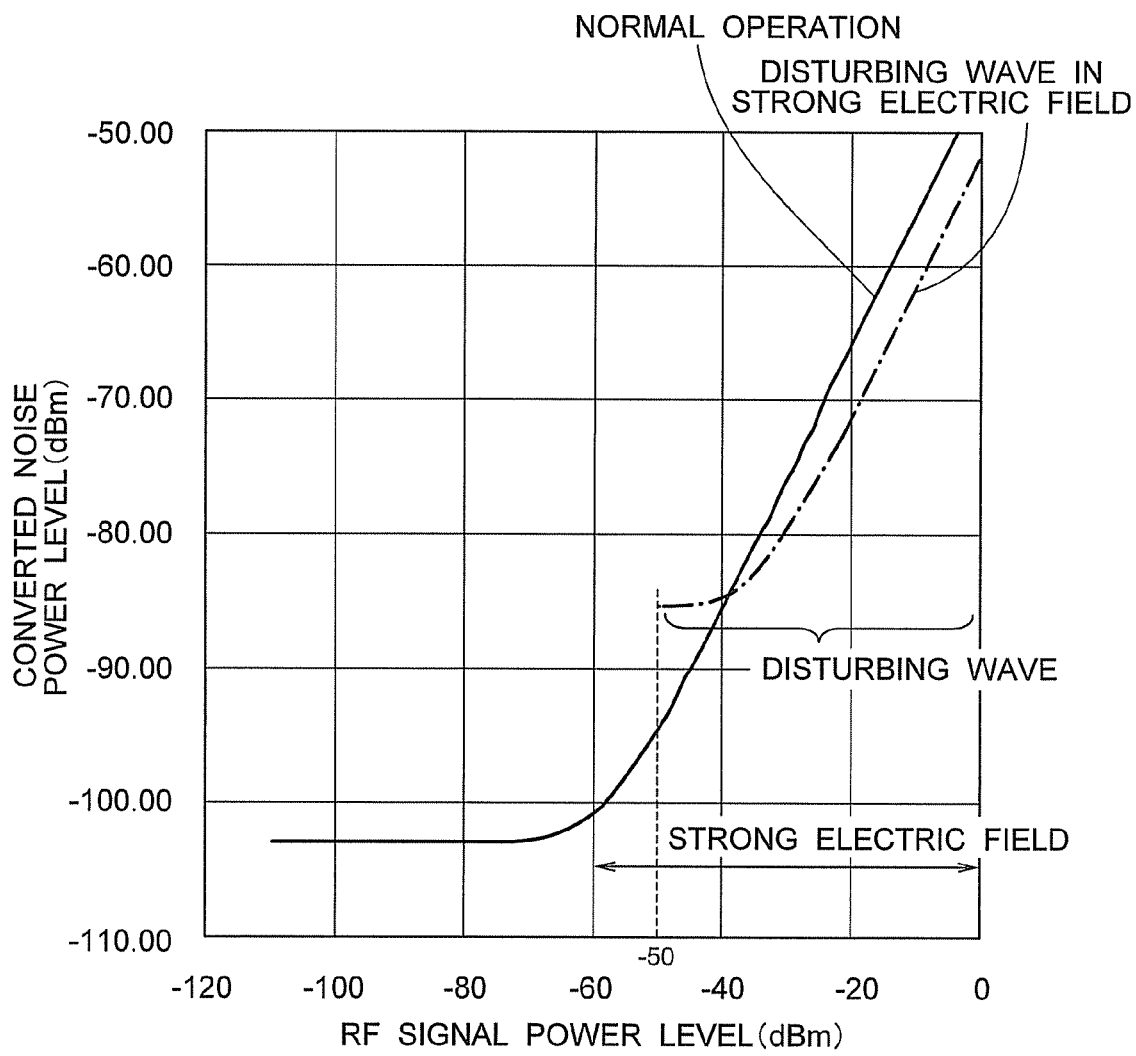
FIG. 4 is a graph showing the noise characteristics of the IF signal of the wireless communication circuit 100 according to the present embodiment.

FIG. 4 shows the noise characteristics of the IF signal of the wireless communication circuit 100 according to the present embodiment. In FIG. 4, the vertical axis represents a converted noise signal level (noise floor level) of the IF signal and the horizontal axis represents an RF signal level.

As shown in FIG. 4, when the RF signal has a high signal level (for example, −60 dBm or higher (strong electric field)) and the RF signal includes a disturbing wave of the certain signal level or higher, the wireless communication circuit 100 implements the foregoing methods 1) and 2). Thus the noise level is lower than in a normal operation and the C/N value of the IF signal is improved.

As described above, the wireless communication circuit 100 performs a normal operation in other cases.

Thus the wireless communication circuit of the present embodiment can reduce the influence of a disturbing wave and improve the C/N value.

Second Embodiment

The first embodiment described the configuration for controlling the gain of the single-to-differential converter circuit.

The same effect can be obtained by controlling the gain of the mixer circuit, as in the case where the gain of the single-to-differential converter circuit is controlled.

The present embodiment will describe a configuration for controlling the gain of a mixer circuit.

Figure 5:
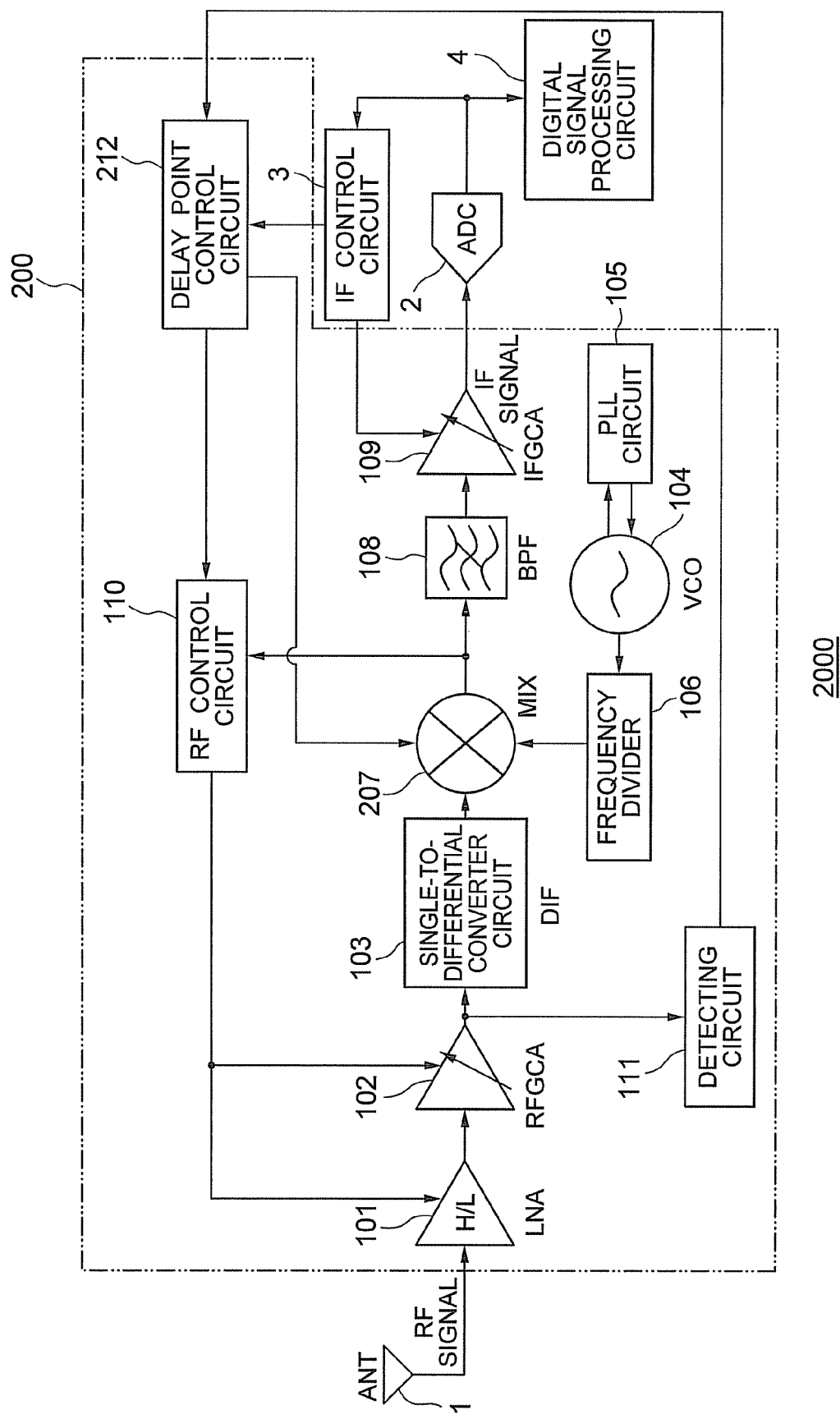
FIG. 5 is a block diagram showing an example of the configuration of a wireless communication system 2000 including a wireless communication circuit 200 according to a second embodiment which is an aspect of the present invention.

FIG. 5 shows an example of the configuration of a wireless communication system 2000 including a wireless communication circuit 200 according to a second embodiment which is an aspect of the present invention.

In the present embodiment, a mixer circuit 207 has a variable gain.

As shown in FIG. 5, a delay point control circuit 212 of the wireless communication circuit 200 controls the gain of the mixer circuit 207, controls a reference level Lb of an RF control circuit 110, and controls the gain of a low noise amplifier 101 through the RF control circuit 110 based on a detection result of a detecting circuit 111.

Other configurations indicated by the same reference numerals as the first embodiment are the same configurations as the first embodiment.

Further, the delay point control circuit 212 controls the gain of the mixer circuit 207 with the same timing as, for example, the case where the delay point control circuit 112 controls the gain of the single-to-differential converter circuit 103 according to the first embodiment.

The wireless communication circuit 200 configured thus can improve the C/N value of the IF signal as in the first embodiment.

In other words, the wireless communication circuit of the present embodiment can reduce the influence of a disturbing wave and improve the C/N value as in the first embodiment.

Third Embodiment

The foregoing embodiments described the configurations for controlling the gain of the single-to-differential converter circuit or the gain of the mixer circuit.

The same effect can be obtained by controlling both of the gains of the single-to-differential converter circuit and the mixer circuit.

The present embodiment will describe a configuration for controlling the gains of a single-to-differential converter circuit and a mixer circuit.

Figure 6:
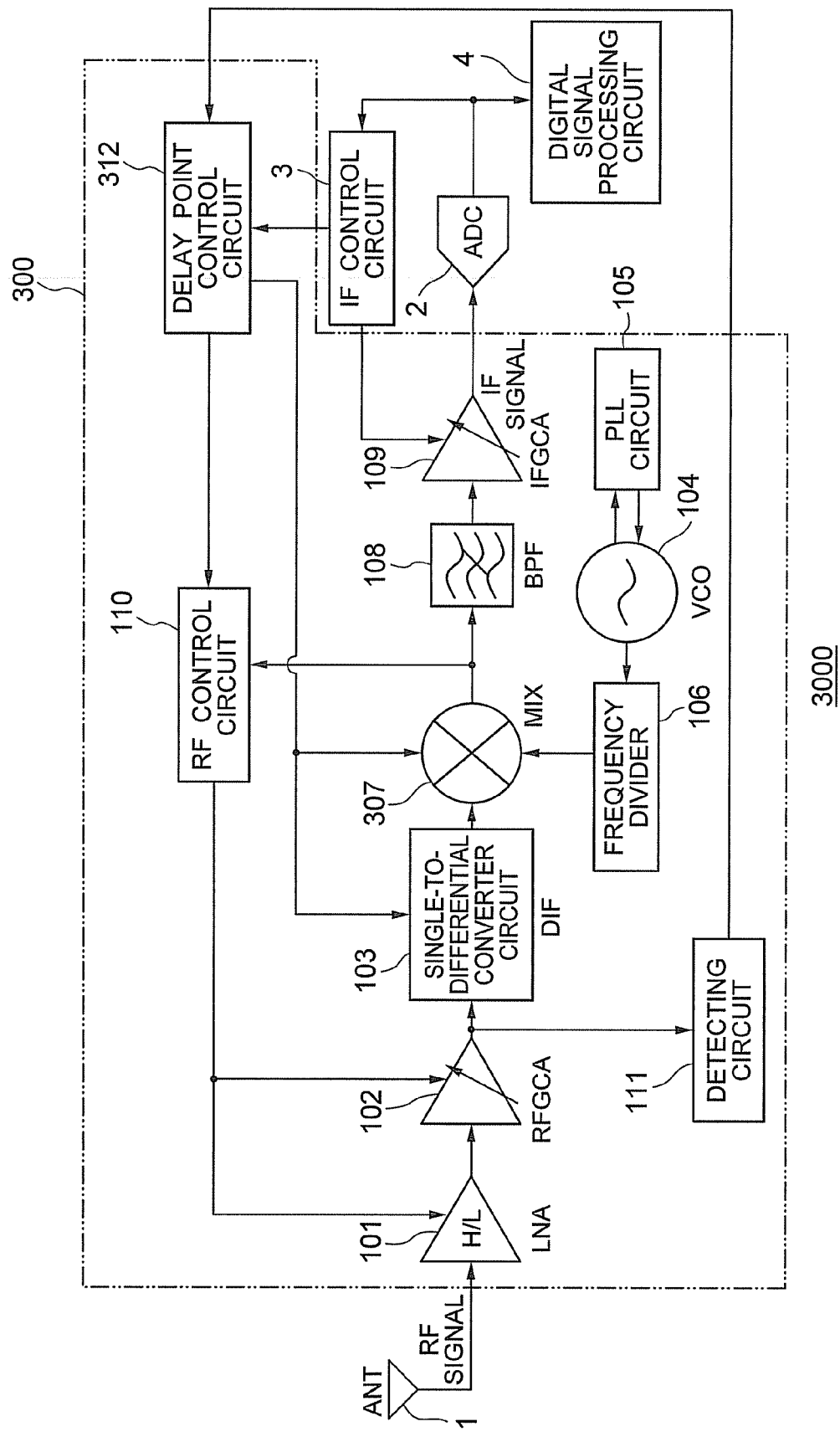
FIG. 6 is a block diagram showing an example of the configuration of a wireless communication system 3000 including a wireless communication circuit 300 according to a third embodiment which is an aspect of the present invention.

FIG. 6 shows an example of the configuration of a wireless communication system 3000 including a wireless communication circuit 300 according to a third embodiment which is an aspect of the present invention. Configurations indicated by the same reference numerals as the first and second embodiments are the same configurations as the first and second embodiments.

As shown in FIG. 6, a delay point control circuit 312 of the wireless communication circuit 300 controls the gains of a single-to-differential converter circuit 103 and a mixer circuit 207, controls a reference level Lb of an RF control circuit 110, and controls the gain of a low noise amplifier 101 through the RF control circuit 110 based on a detection result of a detecting circuit 111.

Further, the delay point control circuit 312 controls the gains of the single-to-differential converter circuit 107 and the mixer circuit 207 with the same timing as, for example, the case where the delay point control circuit 112 controls the gain of the single-to-differential converter circuit 103 according to the first embodiment.

The wireless communication circuit 300 configured thus can improve the C/N value of an IF signal as in the first embodiment.

In other words, the wireless communication circuit of the present embodiment can reduce the influence of a disturbing wave and improve the C/N value as in the first embodiment.

Each of the foregoing embodiments described, as an example, the configuration for controlling the detection level and the gain of the single-to-differential converter circuit (mixer circuit) when the signal level of the RF signal is at least the specified level and the RF signal includes a disturbing wave of the certain level or higher. The detection level and the gains of the single-to-differential converter circuit (mixer circuit) and the low noise amplifier may be controlled when the detecting circuit detects a degradation of the C/N value.

What is claimed is:

1. A wireless communication circuit, comprising:
a low noise amplifier which can switch a gain to a first gain or a second gain lower than the first gain, and amplifies and outputs, with a set gain, an RF signal;
a first gain control amplifier which has a variable gain and amplifies and outputs the signal outputted from the low noise amplifier;
a differential converter which has a variable gain and outputs a differential signal obtained by differential conversion on the signal outputted from the first gain control amplifier;
a mixer circuit which outputs a signal obtained by mixing an oscillation signal and the differential signal;
a filter which filters the signal outputted from the mixer circuit;
a second gain control amplifier which has a variable gain, amplifies and outputs the signal outputted from the filter;
a first control circuit which detects the output signal of the mixer circuit and controls the gains of the low noise amplifier and the first gain control amplifier such that a signal level of the output signal reaches a set reference level; and
a second control circuit which controls the gain of the differential converter and the reference level of the first control circuit based on a signal level of the RF signal and a signal level of a disturbing wave included in the RF signal, and reduces the gain of the differential converter when the signal level of the RF signal is at least a specified level and the RF signal includes a disturbing wave of a predetermined level or higher,
wherein an output of the low noise amplifier is connected with an input of the mixer circuit via the first gain control amplifier and the differential converter, and
wherein the filter does not intervene between the output of the low noise amplifier and the input of the mixer circuit.

2. The wireless communication circuit according to claim 1, wherein the second control circuit further increases the reference level when the signal level of the RF signal is at least the specified level and the RF signal includes a disturbing wave of the predetermined level or higher.

3. The wireless communication circuit according to claim 1, wherein the first control circuit sets the gain of the low noise amplifier at the second gain when the signal level of the RF signal is at least the specified level and the RF signal includes a disturbing wave of the predetermined level or higher.

4. The wireless communication circuit according to claim 2, wherein the first control circuit sets the gain of the low noise amplifier at the second gain when the signal level of the RF signal is at least the specified level and the RF signal includes a disturbing wave of the predetermined level or higher.

5. A wireless communication circuit, comprising:
a low noise amplifier which can switch a gain to a first gain or a second gain lower than the first gain, and amplifies and outputs, with a set gain, an RF signal;

a first gain control amplifier which has a variable gain and amplifies and outputs the signal outputted from the low noise amplifier;

a differential converter which outputs a differential signal obtained by differential conversion on the signal outputted from the first gain control amplifier;

a mixer circuit which has a variable gain and outputs a signal obtained by mixing an oscillation signal and the differential signal;

a filter which filters the signal outputted from the mixer circuit;

a second gain control amplifier which has a variable gain, amplifies and outputs the signal outputted from the filter;

a first control circuit which detects the output signal of the mixer circuit and controls the gains of the low noise amplifier and the first gain control amplifier such that a signal level of the output signal reaches a set reference level; and a second control circuit which controls the gain of the mixer circuit and the reference level of the first control circuit based on a signal level of the RF signal and a signal level of a disturbing wave included in the RF signal, and reduces the gain of the mixer circuit when the signal level of the RF signal is at least a specified level and the RF signal includes a disturbing wave of a predetermined level or higher, wherein an output of the low noise amplifier is connected with an input of the mixer circuit via the first gain control amplifier and the differential converter, and wherein the filter does not intervene between the output of the low noise amplifier and the input of the mixer circuit.

6. The wireless communication circuit according to claim 5, wherein the second control circuit further increases the reference level when the signal level of the RF signal is at least the specified level and the RF signal includes a disturbing wave of the predetermined level or higher.

7. The wireless communication circuit according to claim 5, wherein the first control circuit sets the gain of the low noise amplifier at the second gain when the signal level of the RF signal is at least the specified level and the RF signal includes a disturbing wave of the predetermined level or higher.

8. The wireless communication circuit according to claim 6, wherein the first control circuit sets the gain of the low noise amplifier at the second gain when the signal level of the RF signal is at least the specified level and the RF signal includes a disturbing wave of the predetermined level or higher.

9. A wireless communication system, comprising:

an antenna;

a low noise amplifier which can switch a gain to a first gain or a second gain lower than the first gain, and amplifies and outputs, with a set gain, an RF signal inputted through the antenna;

a first gain control amplifier which has a variable gain and amplifies and outputs the signal outputted from the low noise amplifier;

a differential converter which has a variable gain and outputs a differential signal obtained by differential conversion on the signal outputted from the first gain control amplifier;

a voltage controlled oscillator which outputs an oscillation signal;

a PLL circuit which controls an oscillatory frequency of the oscillation signal by supplying a control voltage to the voltage controlled oscillator;

a mixer circuit which outputs a signal obtained by mixing the oscillation signal or a signal frequency-divided from the oscillation signal and the differential signal;

a filter which filters the signal outputted from the mixer circuit; a second gain control amplifier which has a variable gain, amplifies and outputs the signal outputted from the filter;

a first control circuit which detects the output signal of the mixer circuit and controls the gains of the low noise amplifier and the first gain control amplifier such that a signal level of the output signal reaches a set reference level;

a second control circuit which controls the gain of the differential converter and the reference level of the first control circuit based on a signal level of the RF signal and a signal level of a disturbing wave included in the RF signal, and reduces the gain of the differential converter when the signal level of the RF signal is at least a specified level and the RF signal includes a disturbing wave of a predetermined level or higher;

an analog digital converter which outputs a signal obtained by analog digital conversion on the signal outputted from the second gain control amplifier;

a third control circuit which controls the gain of the second gain control amplifier based on the signal outputted from the analog digital converter; and a digital signal processing circuit which processes the signal outputted from the analog digital converter, wherein an output of the low noise amplifier is connected with an input of the mixer circuit via the first gain control amplifier and the differential converter, and wherein the filter does not intervene between the output of the low noise amplifier and the input of the mixer circuit.

10. The wireless communication system according to claim 9, wherein the second control circuit further increases the reference level when the signal level of the RF signal is at least the specified level and the RF signal includes a disturbing wave of the predetermined level or higher.

11. The wireless communication system according to claim 9, wherein the first control circuit sets the gain of the low noise amplifier at the second gain when the signal level of the RF signal is at least the specified level and the RF signal includes a disturbing wave of the predetermined level or higher.

12. The wireless communication system according to claim 10, wherein the first control circuit sets the gain of the low noise amplifier at the second gain when the signal level of the RF signal is at least the specified level and the RF signal includes a disturbing wave of the predetermined level or higher.

* * * * *